(12) United States Patent
Zhu et al.

(10) Patent No.: US 8,285,072 B2
(45) Date of Patent: Oct. 9, 2012

(54) METHOD AND APPARATUS FOR IMPROVING BRIGHTNESS UNIFORMITY IN AN IMAGE

(75) Inventors: Hua Bin Zhu, Shenzhen (CN); Jian Min Wang, Shenzhen (CN); Cai Xia Fu, Shenzhen (CN); Yan Hong Chen, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 925 days.

(21) Appl. No.: 12/361,728

(22) Filed: Jan. 29, 2009

(65) Prior Publication Data
US 2009/0190854 A1    Jul. 30, 2009

(30) Foreign Application Priority Data
Jan. 29, 2008    (CN) .......................... 2008 1 0005203

(51) Int. Cl.
G06K 9/40    (2006.01)
(52) U.S. Cl. ....... 382/274; 382/260; 382/275; 358/3.26; 358/3.27
(58) Field of Classification Search ................. 382/260, 382/274, 275; 358/3.26, 3.27, 463
See application file for complete search history.

(56) References Cited

U.S. PATENT DOCUMENTS

| | | | | |
|---|---|---|---|---|
| 5,050,607 A * | 9/1991 | Bradley et al. | ................. | 600/423 |
| 5,600,244 A * | 2/1997 | Jensen et al. | .................... | 324/309 |
| 5,715,334 A * | 2/1998 | Peters | ........................... | 382/254 |
| 5,722,410 A * | 3/1998 | NessAiver | ..................... | 600/422 |
| 5,748,904 A * | 5/1998 | Huang et al. | ................... | 345/544 |
| 6,215,911 B1 * | 4/2001 | Goertler et al. | ............... | 382/264 |
| 6,477,398 B1 * | 11/2002 | Mills | ............................. | 600/409 |
| 6,516,213 B1 * | 2/2003 | Nevo | .............................. | 600/424 |
| 7,053,612 B2 * | 5/2006 | St. Pierre et al. | ............ | 324/307 |
| 7,382,129 B2 * | 6/2008 | Mills | ............................. | 324/318 |

* cited by examiner

*Primary Examiner* — Yosef Kassa
(74) *Attorney, Agent, or Firm* — Schiff Hardin LLP

(57) ABSTRACT

In a method and apparatus for improving the brightness uniformity in an image, signals are acquired using a radio frequency receiving coil, and noise in the acquired signals is normalized so as to produce an image, then the brightness of various pixels in the image is determined according to the sensitivity of the radio frequency receiving coil. The brightness of the image is then made uniform by compensating the brightness of the various pixels in the image.

12 Claims, 2 Drawing Sheets

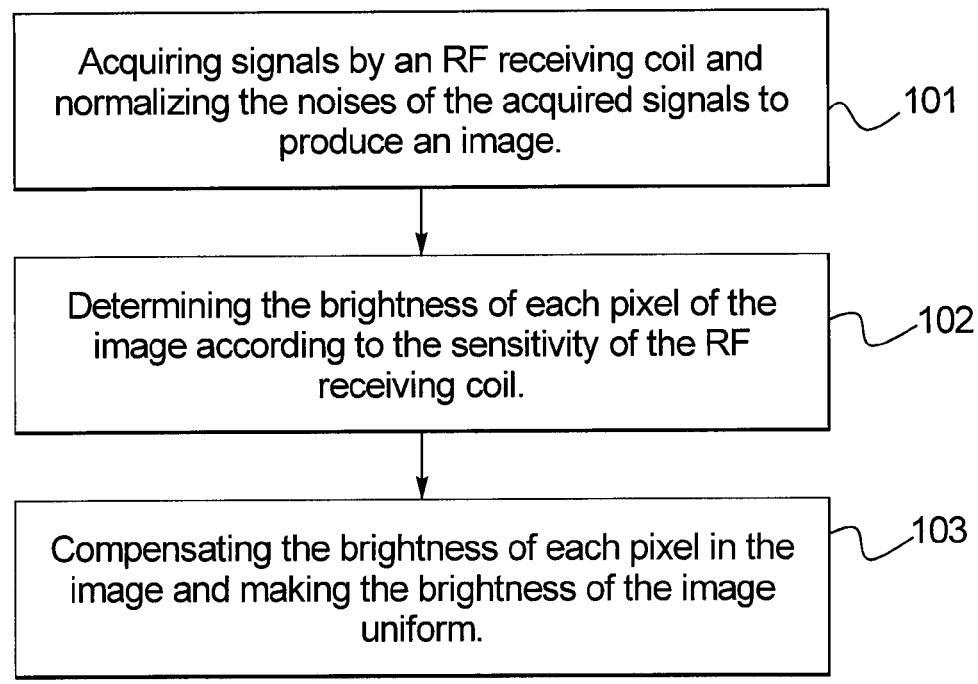
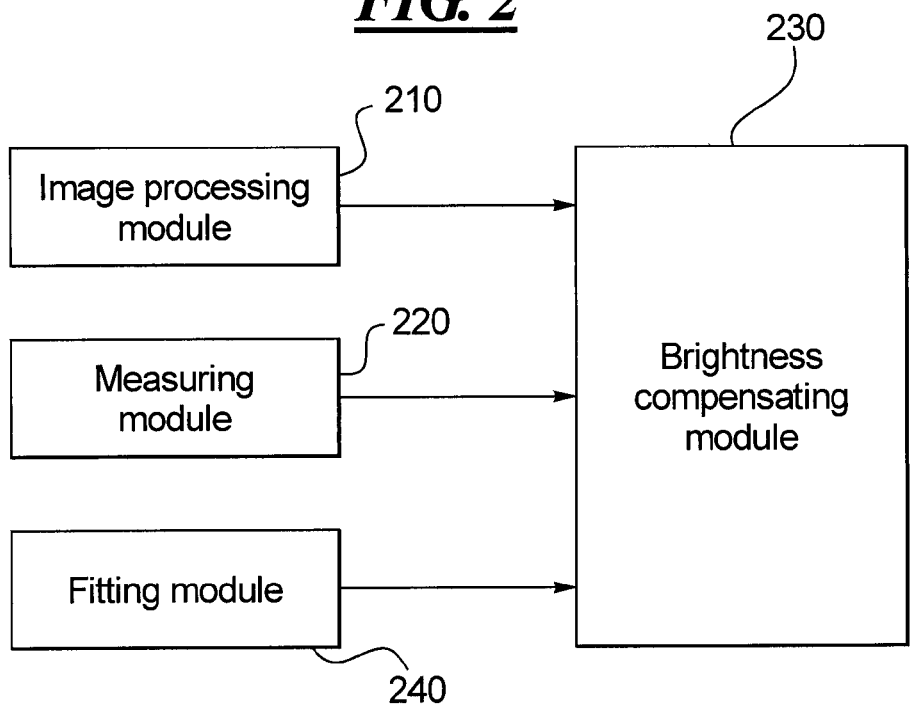

METHOD AND APPARATUS FOR IMPROVING BRIGHTNESS UNIFORMITY IN AN IMAGE

BACKGROUND OF THE INVENTION

1. Field of the Invention

The present invention relates to the magnetic resonance imaging (MRI) technology and, particularly, to a method and apparatus for improving the brightness uniformity in an image.

2. Description of the Prior Art

The basic principle of MRI is that the hydrogen atoms in human tissues will be directionally aligned under the effects of a fixed magnetic field. When applying radio frequency pulses are applied to the human tissues by using a radio frequency transmitting coil, these hydrogen atoms will be displaced due to the effects of the radio frequency pulses, and after the radio frequency pulses end, these hydrogen atoms will recover their original state. During the recovering process, these hydrogen atoms will generate signals, which are acquired via a radio frequency receiving coil. An image is then reconstructed using the acquired signals.

An image is composed of pixels with each of them having a certain brightness and signal-to-noise ratio. In this case, the signal-to-noise ratio is the ratio of the signal magnitude to the noise magnitude in the pixels, where the magnitude of brightness represents the magnitude of the signal. It is well known that uniformity is a very important performance criterion for an image and for a coil. The uniformity of an image can generally be measured by two methods, one of which indicates the uniformity of the signal-to-noise ratio in the image. The other indicates the uniformity of the brightness in the image. The uniformity of a coil is measured by its sensitivity. The relationship between image brightness, signal-to-noise ratio of the image and the sensitivity of the coil is as follows.

Since the image is obtained by image reconstruction from the signals acquired by the radio frequency receiving coil, the sensitivity of the radio frequency receiving coil corresponds to the signal-to-noise ratio of the image.

There is a certain correlation between the uniformity of the signal-to-noise ratio in an image and the uniformity of the brightness in the image, but between them there are also some differences; the correlation between the two uniformities is related to the technology used for carrying out image processing.

When carrying out image processing, it is possible to adopt the technology of noise normalization, and it is also possible to adopt the technology of noise non-normalization. In this case, the noise normalization technology means that, in the case of maintaining the signal-to-noise ratio at each pixel unchanged, the noise at each pixel is normalized to make the noise of each pixel equal. For example: assuming that there are only three pixels P1, P2 and P3 in an image, whose signal intensities (denoted as S1, S2, S3 respectively), noise intensities (denoted as N1, N2, N3 respectively) and signal-to-noise ratios (denoted as SNR1, SNR2, SNR3 respectively) are as follows:

P1: $S1=10$ $N1=1$ $SNR1=10/1=10$
P2: $S2=15$ $N2=2$ $SNR2=15/2=7.5$
P3: $S3=40$ $N3=4$ $SNR3=40/4=10$

The noises of the three pixels mentioned above can be normalized to 2, here it is needed for the noise and signal of P1 to be increased two fold, and for the noise and signal of P3 to be reduced two fold. After having undergone noise-normalization processing as described above, the signal intensities, noise intensities and signal-to-noise ratios of the three pixels are as follows:

P1: $S1=20$ $N1=2$ $SNR1=20/2=10$
P2: $S2=15$ $N2=2$ $SNR2=15/2=7.5$
P3: $S3=20$ $N3=2$ $SNR3=20/2=10$

Theoretically speaking, if the technology used during the image processing is the noise normalization for each pixel, the magnitude of brightness seen from the image reflects the magnitude of signal-to-noise ratio, therefore, if using the technology of noise normalization to carry out image processing, the uniformity of brightness is determined by the uniformity of the sensitivity of the radio frequency receiving coil.

For a radio frequency receiving coil with high uniformity of sensitivity, for example a body coil, the brightness uniformity of the image obtained by the technology of noise normalization is certainly very high; but, for the head coil with relatively poor uniformity of sensitivity or the surface coil with even poorer uniformity of sensitivity, the brightness uniformity of the image obtained by using the technology of noise normalization will be relatively poor, which will cause adverse influences on clinical diagnosis.

SUMMARY OF THE INVENTION

The present invention concerns a method and apparatus for improving the uniformity of image brightness, which effectively improves the uniformity of an image.

The above object is achieved according to the present invention by a method for improving the brightness uniformity in an image including the steps of acquiring signals by using a radio frequency receiving coil, and normalizing the noises of the acquired signals so as to produce the image; determining the brightness of each pixel in the image according to the sensitivity of the radio frequency receiving coil; and compensating the brightness of each pixel in the image to make the brightness of the image uniform.

Preferably, determining the brightness of every pixel in the image according to the sensitivity of radio frequency receiving coil is done by obtaining a sensitivity curve of the radio frequency receiving coil by taking a measurement in advance, and using the sensitivity curve as the image's brightness curve. Compensating the brightness of each pixel of the image to make the brightness of the image uniform is done by compensating the brightness of each pixel of the image according to the brightness curve, so as to make the compensated brightness curve into an approximately horizontal straight line.

Preferably, compensating the brightness of each pixel of the image according to the brightness curve is done by determining a curve whose degree of fitting with the brightness curve reaches a predetermined threshold, and dividing the brightness of each pixel in the image by the value of the curve at the position corresponding to that of the pixel.

Preferably, the curve with a degree of fitting with said brightness curve reaches a predetermined threshold is a curve that varies continuously.

Obtaining the sensitivity curve of the radio frequency receiving coil by taking a measurement in advance is done by predetermining N positions in the signal acquiring range of the radio frequency receiving coil, with the N being an integer greater than or equal to 2, measuring the sensitivity at the N positions, and obtaining the sensitivity curve of the radio frequency receiving coil according to the sensitivity at the N positions.

Predetermining the N positions can be done by predetermining N positions in a direction of the radio frequency receiving coil, in which direction the sensitivity is not uniform.

Predetermining the N positions can be done by predetermining N positions in a plane of the radio frequency receiving coil formed by two directions, wherein the sensitivity is not uniform, or by predetermining N positions in a three-dimensional space of the radio frequency receiving coil formed by three directions, wherein the sensitivity is not uniform.

Any one of the N positions is taken as the origin when determining the curve.

An apparatus for improving the brightness uniformity in an image has an image processing module for acquiring signals by using a radio frequency receiving coil and for normalizing the noises of the acquired signals to produce the image, a measuring module for determining the brightness of each pixel of the image according to the sensitivity of the radio frequency receiving coil, and a brightness compensating module for compensating the brightness of each pixel in the image, so as to make the brightness of the image uniform.

In the apparatus mentioned above, the measuring module can also be used for measuring the sensitivity of said radio frequency receiving coil and using the obtained sensitivity curve of the radio frequency receiving coil as the brightness curve of the image. The brightness compensating module (230) can also be used for compensating the brightness of each pixel of the image according to the brightness curve, so as to make the compensated brightness curve into an approximately horizontal straight line.

The apparatus can have a fitting module for fitting the brightness curve obtained by the measuring module so as to obtain a curve whose degree of fitting with the brightness curve reaches a predetermined threshold. The brightness compensating module can also be used for dividing the brightness of each pixel of the image by the value of the curve at the position corresponding to that of the pixel.

The fitting module can also be used for fitting a curve that varies continuously.

The measuring module can also be used for recording N positions predetermined in the signal acquiring range of the radio frequency receiving coil, and for measuring the sensitivity at the N positions so as to obtain the sensitivity curve of the radio frequency receiving coil, where N is an integer greater than or equal to 2.

The measuring module can be used for recording N positions in a direction of the radio frequency receiving coil in which the sensitivity is not uniform, in a plane formed by two directions in which the sensitivity is not uniform, or in a three dimensional space formed by three directions in which the sensitivity is not uniform.

The fitting module can also be used during the fitting in determining any one of the N positions as the origin.

In the present invention, signals are first acquired by using a radio frequency receiving coil, the noise of the acquired signals is normalized so as to produce the image, then the brightness of each pixel in the image is determined according to the sensitivity of the radio frequency receiving coil. The brightness of each pixel of the image is then compensated to make the brightness of the image uniform, so as to achieve the object of improving the brightness uniformity of the image.

Moreover, since for the image obtained by using the technology of noise normalization the brightness of the image is determined by the sensitivity of the radio frequency receiving coil for carrying out the signal acquisition, in accordance with the present invention a sensitivity curve of the radio frequency receiving coil is obtained by taking a measurement in advance as the image's brightness curve, and then the brightness of each pixel of said image is compensated according to the brightness curve. The sensitivity curve of the radio frequency receiving coil can generally be obtained in advance, so no extra time is needed to acquire it, thereby saving the image processing time and improving work efficiency. Moreover, since the relevant performance criterion of the sensitivity of the radio frequency receiving coil can be measured accurately when the radio frequency receiving coil is manufactured, this leads to relatively high accuracy of the brightness curve determined in the present invention, and this also enables the use of the technical solution of the present invention to improve more effectively the brightness uniformity of the image.

In addition, in the present invention, by fitting the brightness curve to a curve so that the degree of fitting with said brightness curve reaches a predetermined threshold when implementing compensation to the brightness of each pixel of the image, it is possible to divide directly the brightness of each pixel of the image by the value of the curve at the position corresponding to that of the pixel, thus facilitating the compensation process and improving the efficiency.

DESCRIPTION OF THE DRAWINGS

FIG. 1 is a flowchart of a method of the present invention for improving the brightness uniformity of an image.

FIG. 2 is a schematic structural diagram of an apparatus of the present invention for improving the brightness uniformity of an image.

DESCRIPTION OF THE PREFERRED EMBODIMENTS

Figure 3A:
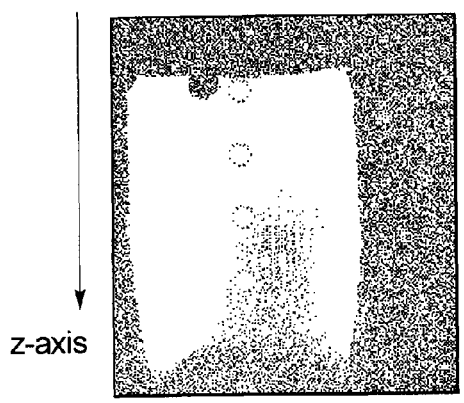
FIG. 3($a$) to FIG. 3($b$) are an exemplary image and the brightness curve of the exemplary image in the direction of the z-axis.

To achieve the aforementioned object, technical solution and advantages of the present invention more apparent, the present invention will be further described in detail below by referring to the accompanying drawings and embodiments.

The basis of the present invention is that of first acquiring signals by using a radio frequency receiving coil, and normalizing the noises of the acquired signals so as to produce the image, then determining the brightness of each pixel in the image according to the sensitivity of the radio frequency receiving coil, and then compensating the brightness of the each pixel of the image to make the brightness of the image uniform, so as to achieve the object of improving the brightness uniformity of the image.

FIG. 1 is a flowchart of the method of the present invention for improving the brightness uniformity of image. Referring to FIG. 1, the method includes:

Step 101: acquiring signals by using a radio frequency receiving coil, and normalizing the noises of the acquired signals so as to produce the image.

In this step, the existing technology of noise normalizing can be used to process the acquired signals, for example, an existing algorithm of sum of square (SOS).

Step 102: determining the brightness of each pixel of the image according to the sensitivity of the radio frequency receiving coil.

In this step, the brightness of each pixel in the image can be determined by way of actual measurement. Preferably, since for the image obtained by using the technology of noise normalization, the brightness of the image is determined by the sensitivity of the radio frequency receiving coil for carrying out the signal acquisition. Hence, if the technology of noise normalization is used to process the image in step 101, then this step can measure a sensitivity curve of the radio frequency receiving coil in advance, and use the sensitivity curve of the radio frequency receiving coil as the image's brightness curve In this way, the brightness of each pixel in the image is determined.

A radio frequency receiving coil suitable to the present invention is that the radio frequency receiving coil must be fixed on some certain position of a patient bed, for example a head coil. For this type of coil, their absolute positions in MRI equipment can be determined at any time, including the positions in the three directions of the x-axis, y-axis and z-axis.

In this step, N positions in the signal acquiring range of said radio frequency receiving coil can be predetermined, and the sensitivity curve of said radio frequency receiving coil is obtained according to the sensitivity measured at said N positions. Said N is an integer greater than or equal to 2.

In a practice application, different ways for predetermining position can be used according to the uniformity of the sensitivity of the radio frequency receiving coil in various directions, specifically:

if the sensitivity of the radio frequency receiving coil is not uniform in only one direction, it is only necessary to improve the image brightness in said direction in which the sensitivity is not uniform, therefore the measurement can be carried out by predetermining N positions only in said direction in which the sensitivity is not uniform;

if the sensitivity of the radio frequency receiving coil is not uniform in one plane formed by two directions, the image brightness can be improved aiming at said plane in which the sensitivity is not uniform, therefore, the measurement can be carried out by predetermining N positions in said plane in which the sensitivity is not uniform; and if the sensitivity of the radio frequency receiving coil is not uniform in a three-dimensional space formed by three directions, it is necessary to improve the image brightness aiming at the entire three-dimensional space, therefore, the measurement can be carried out by predetermining N positions in the three-dimensional space in which the sensitivity is not uniform.

These positions can be predetermined according to a certain time interval, or they can also be predetermined arbitrarily.

Step 103: compensating the brightness of each pixel of the image to make the image brightness uniform.

In this step, during the brightness compensation, the compensation can be carried out according to the brightness of any one of the pixels, or it can also be carried out according to a predetermined brightness reference value Preferably, if the brightness of each pixel of the image is represented by the brightness curve of the image, then in this step, determining first a curve whose degree of fitting with the brightness curve reaches a predetermined threshold, and dividing the brightness of each pixel in the image by the value of the curve at the position corresponding to that of the pixel, so as to facilitate the progress of the compensating process. Since dividing the brightness of each pixel in the image by the value of the curve at the position corresponding to that of the pixel is making compensation to the brightness of each pixel, which reduces the brightness of the pixel with great brightness and increases the brightness of the pixel with low brightness, therefore, after the brightness of each pixel of the image has been divided by the value of the curve at the position corresponding to that of the pixel, the brightness curve of the image will become an approximately horizontal straight line. In this way, an image with a relatively high brightness uniformity can be obtained.

For the reason that the brightness curve of the image described in the present invention is obtained according to actual measurement, the brightness curve does not strictly conform to a certain coordinate expression, here, by way of fitting, a curve whose degree of fitting with the brightness curve reaches a predetermined threshold can be produced, the curve is called the fitting curve in the present invention. The fitting curve can be expressed by a corresponding curve expression, and the fitting curve has good similarity to the actual brightness curve. The higher the degree of fitting between the fitting curve and the brightness curve, the higher the brightness uniformity of finally obtained image. Therefore, the corresponding threshold value can be set according to the requirements of practical applications. For example, the brightness uniformity in an image with a fitting degree of 90% is higher than that with a fitting degree of 80%.

In determining a curve for the fitting curve, any one of the N positions predetermined in step 102 can be taken as the origin, here, said origin is actually a reference point, and at the other points except this point it will carry out brightness conversions by taking the brightness of this point as a reference.

In this step, in order to ensure the continuity and smoothness of noise variation in the image while improving the brightness uniformity of the image, preferably, a continuously changed fitting curve can be produced by fitting.

Up to now, the description of the method of the present invention for improving the uniformity of image brightness is completed.

It can be seen from the above description that the present invention can actually serve as a post-processing of an existing image processing process, for example, first the technology of noise normalization (for example, the existing algorithm of sum of square) can be employed to perform image processing to obtain an image, then compensation is carried out to the brightness of each pixel of the image to obtain an image with improved brightness uniformity.

Theoretically speaking, by using the technical solution of the present invention an image with an infinite uniformity can be obtained, this is because the higher the fitting degree between the fitting curve and the image brightness curve, the higher the uniformity of the image brightness by using the technical solution of the present invention. Moreover, at the same time as compensating the brightness of each pixel of the image, the noise of the pixel can be correspondingly adjusted according to the signal-to-noise ratio of each pixel, so as to keep the signal-to-noise ratio of each pixel of the image unchanged, that is: to improve the uniformity of the image under the precondition of not to reduce the signal-to-noise ratio of the image.

FIG. 2 is a schematic structural diagram of an apparatus of the present invention for improving the brightness uniformity of an image. As shown in FIG. 2, the apparatus has an image processing module 210 for acquiring signals by using a radio frequency receiving coil and for normalizing the noises of the acquired signals to produce the image, a measuring module 220 for determining the brightness of each pixel of the image according to the sensitivity of the radio frequency receiving coil, and a brightness compensation module 230 for compensating the brightness of each pixel in the image, so as to make the brightness of the image uniform.

The measuring module 220 in the apparatus shown in FIG. 2 is also used for measuring the sensitivity of said radio frequency receiving coil and taking the obtained sensitivity curve of the radio frequency receiving coil as the brightness curve of the image. Additionally the brightness compensation module 230 is also used for compensating the brightness of each pixel of the image according to said brightness curve, so as to make the compensated brightness curve into an approximately horizontal straight line.

The apparatus shown in FIG. 2 can further has a fitting module 240 for fitting the brightness curve obtained by the measuring module 220 so as to obtain a curve whose degree of fitting with the brightness curve reaches a predetermined threshold. The brightness compensation module 230 can also be used for dividing the brightness of each pixel of the image by the value of the curve at the position corresponding to that of the pixel.

Preferably, when implementing the fitting, the fitting module 240 is used for fitting a curve that varies continuously.

The measurement module 220 shown in FIG. 2 is also used for recording N positions predetermined in the signal acquiring range of said radio frequency receiving coil, and for measuring the sensitivity at the N positions so as to obtain the sensitivity curve of said radio frequency receiving coil, and said N is an integer greater than or equal to 2.

The measuring module 220 shown in FIG. 2 is used for recording N positions in a direction of the radio frequency receiving coil in which the sensitivity is not uniform, in a plane formed by two directions in which the sensitivity is not uniform, or in a three-dimensional space formed by three directions in which the sensitivity is not uniform.

The fitting module 240 shown in FIG. 2 is also used during the fitting in determining any one of said N positions as the origin.

The method for improving the uniformity of image brightness in the present invention will be further described below by way of an example.

Figure 3B:
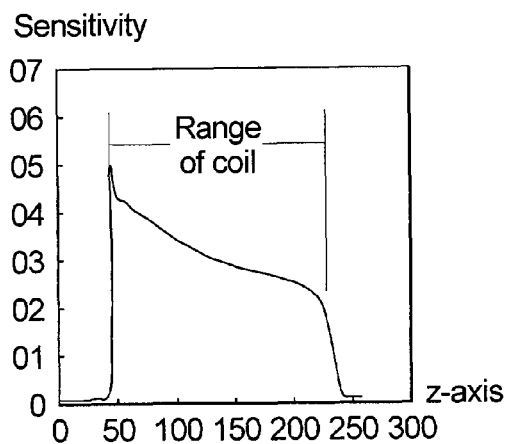

In this example, it is assumed that the sensitivity of the radio frequency receiving coil in the direction of z-axis is not uniform. FIG. 3(*a*) shows the image obtained by carrying out the signal acquisition at a corresponding portion of a human body by using the radio frequency receiving coil and by carrying out image processing by the existing technology of signal-to-noise ratio normalization. Five areas from upper to lower along the direction of the z-axis shown in the figure are taken, and the mean brightness, center coordinate and number of pixels in said five areas are shown in the right-hand half section of FIG. 3(*a*). The mean brightness of the five areas are respectively 417.4, 344.8, 290.2, 260.1 and 204.1. It can be seen that the uniformity of brightness signal-to-noise ratio of the image in the direction of the z-axis is relatively poor.

According to the method provided in the present invention, first the sensitivities of some predetermined positions can be measured in the direction of the z-axis within the signal acquiring range of the radio frequency receiving coil to obtain the sensitivity curve shown in FIG. 3(*b*). Since FIG. 3(*a*) is obtained by carrying out image processing using the technology of signal-to-noise ratio normalization, the sensitivity curve of the radio frequency receiving coil is made equivalent to the signal-to-noise curve of the image, and also equivalent to the brightness curve of the image. Assuming that the resolution of the image shown in FIG. 3(*a*) is 256*256, then there are altogether 256 pixels along the direction of the z-axis, thus the positions of these 256 pixels can be directly determined as measuring positions to perform the measurement of sensitivity. It can be seen from FIG. 3(*b*) that said sensitivity curve is in a descending trend from the origin along the direction of the z-axis and within the signal acquiring range of the radio frequency receiving coil.

Then, the sensitivity curve shown in FIG. 3(*b*) can be fitted. Assuming that the characteristic of said sensitivity curve is very close to an e exponent curve, and then the curve expression for the fitting curve can be expressed by using standard expression for the exponential curve:

$$f(z)=e^{(a*z+b)} \tag{1}$$

in the function (1), a and b are constants, z represents the coordinates of a predetermined position. It is well known for those skilled in the art that formula (1) can also be expressed in the form of functions (2) and (3):

$$f(z)=e^{a*(z+b/a)} \tag{2}$$

$$f(z)=e^{b}*e^{a*z} \tag{3}$$

in function (3), $e^b$ is a constant.

When carrying out said fitting, the position of any one of the 256 pixels in the z-axis can be taken as the origin, for example, taking the pixel in the middle position, that is, the position of the 128th pixel, as the origin, then the positions of other pixels are original coordinates subtracted by 128, that is: (z□128).

Assuming that the reciprocal of said f (z) is:

$$Corr=e^{0.004*(z-128)} \tag{4}$$

then, multiplying Corr by f (z) will obtain a straight line, and since f (z) has a relatively high degree of fitting with the sensitivity curve, multiplying Corr on the basis of an image will obtain an image with very good brightness uniformity, when represented in the brightness curve, that means a brightness curve approximately close to a horizontal straight line within the signal acquiring range of the radio frequency receiving coil will be obtained.

Figure 4A:
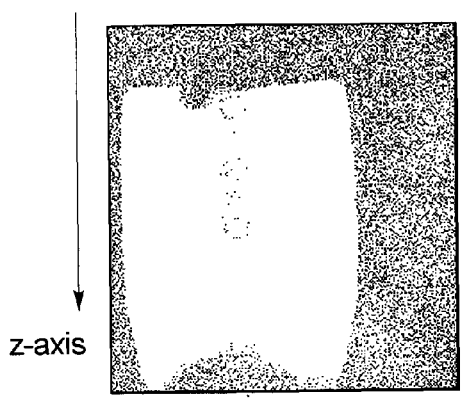
FIG. 4($a$) to FIG. 4($b$) are an image obtained after the brightness uniformity of the image has been improved by applying the method of the present invention to the exemplary image shown in FIG. 3($a$), and the brightness curve of the image in the direction of the z-axis.
Figure 4B:
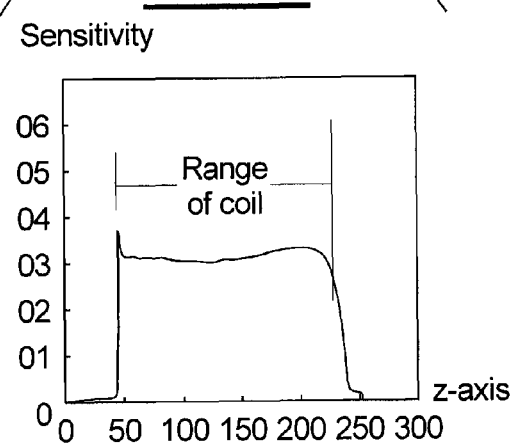

FIG. 4(*a*) is an image obtained by improving the brightness uniformity of the image shown in FIG. 3(*a*) by using the method in the present invention, FIG. 4(*b*) shows the brightness curve of the image shown in FIG. 4(*a*) in the direction of the z-axis. It can be seen from FIGS. 4(*a*) and 4(*b*) that the brightness uniformity of an image is effectively improved by using the present invention.

It can be seen from the above described technical solution that in the present invention, first, signals are acquired by using a radio frequency receiving coil, and the noises of the acquired signals are normalized so as to produce the image; then the brightness of each pixel in the image is determined according to the sensitivity of the radio frequency receiving coil; and finally the brightness of each pixel of the image is compensated to make the brightness of the image uniform, so as to achieve the object of improving the brightness uniformity of the image.

Moreover, since for the image obtained by using the technology of noise normalization, the brightness of the image is determined by the sensitivity of the radio frequency receiving coil for carrying out signal acquisition. Therefore, in accordance with the present invention, the process for obtaining a sensitivity curve of the radio frequency receiving coil is implemented by taking a measurement in advance as the image's brightness curve, and the brightness of each pixel of said image is implemented according to the brightness curve. The sensitivity curve of the radio frequency receiving coil can generally be obtained in advance, and no extra time is needed to acquire it, thereby saving the image processing time and improving work efficiency. Moreover, since the relevant performance criterion of the sensitivity of the radio frequency receiving coil can be measured accurately when the radio frequency receiving coil is manufactured, this leads to relatively high accuracy of the brightness curve determined in the present invention, and this also enables the use of the technical solution of the present invention to improve more effectively the brightness uniformity of the image.

In addition, in the present invention, by fitting the brightness curve, a curve is produced whose degree of fitting with the brightness curve reaches a predetermined threshold, so that when carrying out compensation to the brightness of each pixel of the image. This makes it possible to directly divide the brightness of each pixel of the image by the value of the curve at the position corresponding to that of the pixel, so as to facilitate said compensation process, and to improve the efficiency.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for improving the brightness uniformity in an image, comprising the steps of:
   acquiring signals by using a radio frequency receiving coil, and normalizing the noises of the acquired signals so as to produce the image;
   determining the brightness of each pixel in the image according to the sensitivity of the radio frequency receiving coil by obtaining a sensitivity curve of the radio frequency receiving coil by taking a measurement in advance thereto, and using said sensitivity curve as the image's brightness curve; and wherein compensating the brightness of each pixel of the image to make the brightness of the image uniform comprises compensating the brightness of each pixel of said image according to said brightness curve, so as to make the compensated brightness curve into an approximately horizontal straight line; and
   compensating the brightness of the each pixel of the image to make the brightness of the image uniform by determining a curve whose degree of fitting with said brightness curve reaches a predetermined threshold, and dividing the brightness of each pixel in the image by the value of the curve at the position corresponding to that of the pixel.

2. The method as claimed in claim 1, comprising employing, as said curve whose degree of fitting with said brightness curve reaches a predetermined threshold, a curve that varies continuously.

3. The method as claimed in claim 2, wherein obtaining the sensitivity curve of the radio frequency receiving coil by taking a measurement in advance comprises:
   predetermining N positions in the signal acquiring range of said radio frequency receiving coil, with said N being an integer greater than or equal to 2;
   measuring the sensitivity at said N positions; and
   obtaining the sensitivity curve of said radio frequency receiving coil according to the sensitivity at said N positions.

4. The method as claimed in claim 3, comprising predetermining said N positions by predetermining N positions in a direction of said radio frequency receiving coil in which direction the sensitivity is not uniform.

5. The method as claimed in claim 3, comprising predetermining said N positions by predetermining N positions in a plane of said radio frequency receiving coil formed by two directions, in which the sensitivity is not uniform.

6. The method as claimed in claim 3, comprising predetermining said N positions by predetermining N positions in a three dimensional space of said radio frequency receiving coil formed by three directions, in which the sensitivity is not uniform.

7. The method as claimed in claim 3, wherein determining the curve whose degree of fitting with said brightness curve reaches a predetermined threshold comprises taking any one of said N positions as the origin when determining said curve.

8. An apparatus for improving the brightness uniformity in an image, comprising:
   an image processing module that acquires signals by using a radio frequency receiving coil and for normalizing the noises of the acquired signals to produce the image;
   a measuring module configured to determine the brightness of each pixel of the image according to the sensitivity of the radio frequency receiving coil by measuring the sensitivity of said radio frequency receiving coil and taking the obtained sensitivity curve of the radio frequency receiving coil as the brightness curve of the image;
   a brightness compensating module is configured to compensate the brightness of each pixel in the image, so as to make the brightness of the image uniform by compensating the brightness of each pixel of the image according to said brightness curve, to make the compensated brightness curve into an approximately horizontal straight line;
   a fitting module configured to fit the brightness curve obtained by the measuring module to obtain a curve whose degree of fitting with said brightness curve reaches a predetermined threshold; and
   said brightness compensating module being configured to divide the brightness of each pixel of the image by the value of the curve at the position corresponding to that of the pixel.

9. The apparatus as claimed in claim 8, wherein said fitting module is also for fitting a curve that varies continuously.

10. The apparatus as claimed in claim 9, wherein said measuring module is configured to record N positions predetermined in the signal acquiring range of said radio frequency receiving coil, and to measure the sensitivity at said N positions to obtain the sensitivity curve of said radio frequency receiving coil, wherein N is an integer greater than or equal to 2.

11. The apparatus as claimed in claim 10, wherein said measuring module is configured to record N positions in a direction of the radio frequency receiving coil in which the sensitivity is not uniform, in a plane formed by two directions in which the sensitivity is not uniform, or in a three dimensional space formed by three directions in which the sensitivity is not uniform.

12. The apparatus as claimed in claim 10, wherein said fitting module is configured to, during the fitting, use any one of said N positions as the origin.

* * * * *